United States Patent
Matsumoto

(10) Patent No.: US 6,518,150 B1
(45) Date of Patent: Feb. 11, 2003

(54) METHOD OF MANUFACTURING SEMICONDUCTOR DEVICE

(75) Inventor: Muneyuki Matsumoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/449,472

(22) Filed: Nov. 29, 1999

(30) Foreign Application Priority Data

Dec. 10, 1998 (JP) .......................................... 10-351862

(51) Int. Cl.⁷ ............................................ H01L 21/265
(52) U.S. Cl. ...................................... 438/527; 438/528
(58) Field of Search ................................... 438/527, 528, 438/514, 918, 795, 535, 530

(56) References Cited

U.S. PATENT DOCUMENTS

| | | | | |
|---|---|---|---|---|
| 5,162,241 A | * | 11/1992 | Mori et al. .................. | 438/528 |
| 5,445,975 A | * | 8/1995 | Gardner et al. ............. | 438/528 |
| 5,506,167 A | * | 4/1996 | Chen et al. .................. | 438/528 |
| 5,561,072 A | * | 10/1996 | Saito .......................... | 438/528 |
| 5,578,507 A | * | 11/1996 | Kuroi .......................... | 438/528 |
| 5,585,286 A | * | 12/1996 | Aronowitz et al. ......... | 438/528 |
| 5,633,177 A | * | 5/1997 | Anjum ........................ | 438/528 |
| 5,654,209 A | * | 8/1997 | Kato ........................... | 438/528 |
| 5,654,210 A | * | 8/1997 | Aronowitz et al. ......... | 438/528 |
| 5,789,310 A | * | 8/1998 | Pramanick et al. ......... | 438/528 |
| 5,837,597 A | * | 11/1998 | Saito .......................... | 438/528 |
| 5,858,864 A | * | 1/1999 | Arnowitz et al. ........... | 438/528 |
| 5,885,886 A | * | 3/1999 | Lee ............................. | 438/528 |
| 5,940,722 A | * | 8/1999 | Tamura ...................... | 438/471 |
| 6,008,098 A | * | 12/1999 | Pramanick et al. ......... | 438/305 |
| 6,037,204 A | * | 3/2000 | Chang et al. ............... | 438/528 |
| 6,136,673 A | * | 10/2000 | Frei et al. ................... | 438/545 |
| 6,184,112 B1 | * | 2/2001 | Maszara et al. ............ | 438/528 |
| 6,235,599 B1 | * | 5/2001 | Yu .............................. | 438/305 |

* cited by examiner

Primary Examiner—Savitri Mulpuri
(74) Attorney, Agent, or Firm—Volentine Francos, PLLC

(57) ABSTRACT

In a wafer treating process, an impurity ion implanting, an Si+ ion implanting and an annealing are successively effected on an Si substrate. In the impurity ion implanting, an impurity ion is introduced into the Si substrate by ion implantation using a projected range. In the Si+ ion implanting, an Si+ ion is introduced into the Si substrate subjected to the impurity ion implanting by ion implantation using a projected range smaller than the above projected range. In the annealing, the Si substrate subjected to the impurity ion implanting and the Si+ ion implanting is subjected to heat treatment. As a result, the Si+ ion introduced in the Si+ ion implanting is bonded to each vacancy defect developed in the impurity ion implanting in the wafer treating process, so that the occurrence of crystal defects due to the vacancy defects is inhibited.

3 Claims, 1 Drawing Sheet

METHOD OF MANUFACTURING SEMICONDUCTOR DEVICE

BACKGROUND OF THE INVENTION

1. Field of the Invention

This invention relates to a method of manufacturing a semiconductor device.

2. Description of the Related Art

In a method of manufacturing a semiconductor device, the introduction (doping) of impurities into a semiconductor substrate by ion implantation (also called [Impla]) is now widely used for the formation of, e.g., an impurity diffused layer (hereinafter called simply [diffused layer]), a P-N junction, etc.

Since the practical utilization of high-energy ion implantation, particularly, the formation of a relatively deep extended diffused layer by ion implantation is facilitated and the uses of the ion implantation for the method of manufacturing the semiconductor device have been further increased. In a method of manufacturing a CMOS type LSI, for example, a start has already been made at heavily using MeV (Mega electron volt)-class high energy ion implantation upon formation of a PWELL layer and a NWELL layer in an Si (Silicon) substrate.

The ion implantation has been heavily used in the semiconductor device manufacturing method as described above because it is excellent in controllability and reproducibility. On the other hand, the ion implantation has the demerits of making it easy to produce crystal defects in a semiconductor layer doped with an impurity. Thus, the application of the ion implantation to the method of manufacturing the semiconductor device needs a technique for inhibiting the occurrence of the crystal defects.

The occurrence of the crystal defects by the ion implantation will first be described with ion implantation for an Si substrate as an example. Upon the ion implantation for the Si substrate, two types of point defects corresponding to an excessive Si defect and a vacancy defect are normally developed as crystal damage to the Si substrate. The excessive Si defect is of a defect in which excessive Si atoms exist between Si crystal lattices and generally results in a main crystal defect at a portion deeper than a range of projection or projected range Rp of an impurity ion, where the density of interstitial Si increases. On the other hand, the vacancy defect is of a defect in which Si atoms are missed out of the Si crystal lattice and generally results in a main crystal defect at a portion shallower than a projected range Rp of an impurity ion, where the density of the vacancy defect increases.

In order to restore or repair such point defects, the conventional method of manufacturing the semiconductor device adopts a process of effecting subsequent or post heat treatment (annealing) on an Si substrate after the implantation of an impurity ion to thereby activate an impurity and recover the point defects.

However, the simple execution of the post-annealing makes it difficult to completely restore the above-described point defects. Thus, in the conventional method of manufacturing the semiconductor device, for example, the remaining point defects form a dislocation loop upon the post-annealing or are bonded to interstitial oxygen so that oxygen precipitated nuclei are easy to be formed. At a portion deeper than a projected range Rp of an impurity ion employed in the ion implantation in particular, the formed excessive Si defect is liable to produce a dislocation loop in the post-annealing and hence the restoring of the point defects falls into difficulties.

Restoring the point defects by the post-annealing generally needs high temperature annealing. Their restoration normally needs annealing at a temperature of about 800° C. or more. In high energy ion implantation in particular, a large number of defects might remain even in the case of annealing at a temperature of about 1000° C. or more as well as difficulties encountered in completely restoring the defects in the case of the annealing at the temperature of the order referred to above. Further, the high temperature annealing has fallen into difficulties due to the progression of an increase in the diameter of a silicon wafer or the like in recent years. Thus, the restoration of the defects developed upon ion implantation is becoming increasingly difficult.

As described above, the conventional method of manufacturing the semiconductor device has the potential for the residual of the point defects within an impurity diffused region or aggregation growth of secondary and tertiary defects. Thus, there is a possibility that a bad influence will be exerted on electrical characteristics of the semiconductor device.

SUMMARY OF THE INVENTION

The present invention has been made to solve the above and other problems involved in the conventional method of manufacturing the semiconductor device.

In order to solve the above problems, the invention related to the present application provides a method of manufacturing a semiconductor device, including a first ion implanting step for introducing a predetermined impurity ion into a semiconductor layer by ion implantation using a first range of projection, which adopts a construction to be described below.

Namely, the invention adopts a construction including a second ion implanting step for introducing ions of a material element for a semiconductor layer itself into the semiconductor layer by ion implantation using a second projected range smaller than the first projected range. In the present construction, the material element for the semiconductor layer, which has been introduced in the second ion implanting step, is bonded to each vacancy defect developed in a region in the semiconductor layer, which is shallower than the first projected range in the first ion implanting step.

Thus, the amount of residual of the vacancy defects in the semiconductor layer can be reduced and the generation of various high-order defects (e.g., oxygen precipitated nuclei and metal precipitated nuclei, etc.) developed from the vacancy defects can be inhibited. Since the vacancy defects are generally easy to occur at a portion shallower than a projected range (Rp) for ion implantation when the ion implantation is done, the present construction is capable of effectively inhibiting the occurrence of the oxygen precipitated nuclei.

The invention adopts a construction including a preliminary annealing step done before the first ion implanting step and for diffusing interstitial oxygen lying in the vicinity of the surface of a semiconductor layer by annealing except for the first ion implanting step. In the present construction, the interstitial oxygen is diffused outside the semiconductor layer in the preliminary annealing step. Thus, the oxygen bonded to each vacancy defect is reduced in the neighborhood of the surface of the semiconductor layer so that the generation of oxygen precipitated nuclei can be inhibited or controlled. Since the vacancy defects are normally apt to occur in the vicinity of the surface of the semiconductor layer, the present construction can effectively inhibit the occurrence of the oxygen precipitated nuclei.

The invention adopts a construction including a third ion implanting step executed after the first ion implanting step and for introducing ions of a predetermined element different from an introduced impurity into a semiconductor layer by ion implantation using a third projected range greater than the first projected range, except for the first ion implanting step. In the present construction, vacancy defects can be generated between the first projected range and the third projected range, i.e., a region deeper than the first projected range in the semiconductor layer. Since such vacancy defects are bonded to high concentration defects of a material element for the semiconductor layer, the generation of crystal defects in the semiconductor layer can be eventually inhibited.

In the present construction, each high concentration defect of a material element for a new semiconductor layer is produced in a region deeper than the third projected range. However, the position of generation of such a defect is placed in the region deeper than the first projected range in the semiconductor layer. Namely, the present construction takes such a form that the high concentration defects of the material element for the semiconductor layer are deeply forced into the semiconductor layer. Thus, according to the present construction, the high concentration defects can be forced into a deep region corresponding to such an extent that it is possible to ignore the influence exerted on electrical characteristics of the semiconductor device. Since the high concentration defects of the element for the semiconductor layer normally occur in the region deeper than the first projected range, the present construction can effectively inhibit the influence of the high concentration defects on the electrical characteristics of the semiconductor device.

As in the invention as defined in a further embodiment, O-group elements (also called inert gases or noble gases) may be used as the predetermined element.

As in the invention as defined in a still further embodiment, the third ion implanting step may be repeated twice or more while the range of projection is being extended sequentially.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
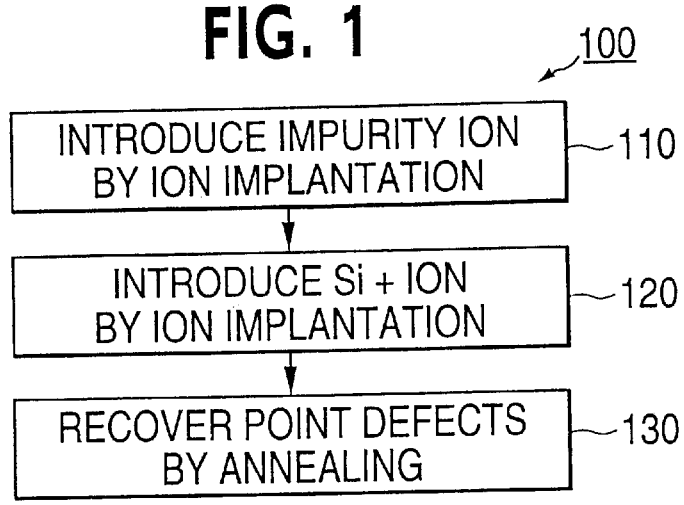
FIG. 1 is a flowchart for describing a method of manufacturing a semiconductor device to which the present invention is applicable.

Preferred embodiments of the present invention will hereinafter be described in detail with reference to the accompanying drawings. In the following description and accompanying drawings, elements of structure having the same function and construction are identified by the same reference numerals and the description of certain common elements will therefore be omitted.

(First Embodiment)

A first embodiment will first be explained with reference to FIG. 1. FIG. 1 is a flowchart for describing a wafer treating process 100 employed in a method of manufacturing a semiconductor device, according to the present embodiment.

In the wafer treating process 100, an impurity ion implanting step 110 corresponding to a first ion implanting step, an Si+ ion implanting step 120 corresponding to a second ion implanting step, and a heat treatment or annealing step 130 corresponding to a subsequent or post-annealing step are successively performed as shown in FIG. 1.

It is needless to say that the wafer treating process 100 may include, for example, a thin film forming step, an oxidizing step, a resist processing step, an exposing step, an etching step, a cleaning step or other steps such as another impurity introducing step, another annealing step, etc. It is also needless to say that the method of manufacturing the semiconductor device, according to the present embodiment may include other steps such as a mask manufacturing step, an assembling step or an inspecting step, etc. except for the wafer treating process 100.

In the ion implanting step 110, an impurity ion is first introduced into an Si substrate by ion implantation using a determined range of projection or projected range Rp1. Now, the method of manufacturing the semiconductor device according to the present embodiment can adopt a construction wherein various impurities such as boron (B), phosphorus (P), arsenic (A), etc. are introduced into the Si substrate.

In the ion implanting step 120 employed in the present embodiment, an Si+ ion is next introduced into the Si substrate subjected to the ion implanting step 110 by ion implantation using a projected range Rp2 smaller than the projected range Rp1. In such an ion implanting step 120, the Si+ ion is introduced into the Si substrate with such accelerating energy that the peak of the projected range Rp2 falls within a range corresponding to 0.5 to 0.9 times the projected range Rp1.

In the ion implanting step 120, the dose of the Si+ ion to be introduced is set to such an extent that it is necessary to fill up excessive vacancy defects developed in the Si substrate in the ion implanting step 110. Such dose can be set from, for example, a process simulation, the past result of experiments, etc.

In the annealing step 130, the Si substrate, which has undergone the ion implanting step 110 and the ion implanting step 120, is subjected to annealing similar to the conventional one. Namely, in the annealing step 130, the Si substrate is heat-treated at a temperature of from, for example, about 800° C. to 1000° C. and thereby the impurity ion in the Si substrate is activated to restore each point defect.

In the present embodiment described above, the Si+ ion is introduced into the Si substrate separately from the impurity ion. In the post-annealing step, such an Si+ ion is diffused within the Si substrate and falls into each vacancy defect. Namely, the vacancy defects developed by ion implantation using the impurity ion can be reduced owing to Si+. It is also possible to inhibit the occurrence of oxygen precipitated nuclei, precipitated nuclei of metal ions, etc. at a portion shallower than the projected range Rp of the impurity ion. As a result, an impurity diffused layer good in characteristic can be formed. Incidentally, the present embodiment may adopt a construction wherein in the wafer treating process 100, the executing order of the ion implanting step 120 and the ion implanting step 110 is changed and the ion implanting step 120 is first executed whereas the ion implanting step 110 is executed later.

(Second Embodiment)

Figure 2:
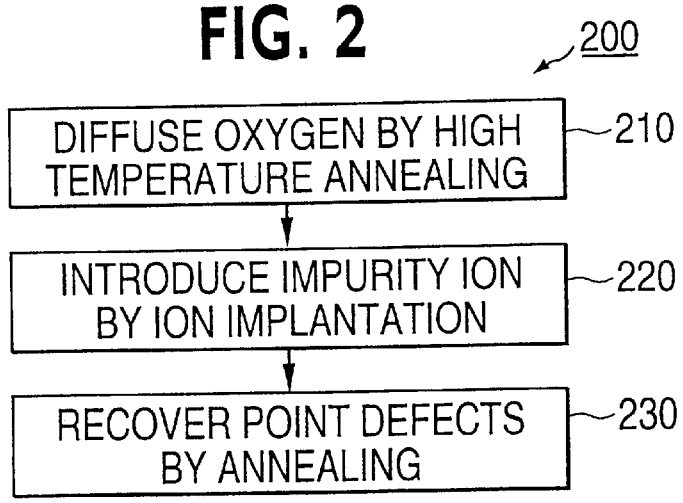
FIG. 2 is a flowchart for describing another method of manufacturing a semiconductor device to which the present invention is applicable.

A second embodiment will next be described with reference to FIG. 2. FIG. 2 is a flowchart for describing a wafer treating process 200 of a method of manufacturing a semiconductor device according to the present embodiment.

In the wafer treating process 200, a heat treatment or annealing step 210 corresponding to a preliminary annealing step, an ion implanting step 220 corresponding to a first ion implanting step, and an annealing step 230 corresponding to a subsequent or post-annealing step are executed as shown in FIG. 2.

It is needless to say that the wafer treating process 200 may include, for example, a thin film forming step, anoxidizing step, a resist processing step, an exposing step, an etching step, a cleaning step or other steps such as another impurity introducing step, another annealing step, etc. It is also needless to say that the method of manufacturing the semiconductor device, according to the present embodiment may include other steps such as a mask manufacturing step, an assembling step or an inspecting step, etc. except for the wafer treating process 200.

In the annealing step 210 of the wafer treating process 200, an Si substrate is heat-treated for a long time in a high-temperature atmosphere, and interstitial oxygen lying in the neighborhood of the surface of the Si substrate is diffused outside the Si substrate. The annealing step 210 will be described more specifically. In the annealing step 210, an oxide film ranging from 50 nm to 200 nm is grown or deposited over the surface of the Si substrate by oxidation treatment at a temperature of about 1000° C., for example. Next, the thus-grown oxide film is heat-treated for, for example, two hours or more at a temperature of about 1100° C., for example. Finally, the Si substrate is cooled. Incidentally, heating and cooling rates in the annealing step 210 may respectively preferably be set to such an extent that no distortion occurs in the Si substrate.

According to findings of the present inventors, when the Si substrate is subjected to high temperature treatment at a temperature of about 1100° C. or more, the interstitial oxygen on the surface side of the activated Si substrate is easy to be diffused outside the Si substrate during the cooling process of the Si substrate in particular. Owing to the execution of such high temperature annealing, the concentration of the interstitial oxygen is reduced to greater than or equal to a range of 1 digit to 0.5 digit as compared with concentrations (0.8 to $1.4e^{18}$ATMOs/CC at OLD ASTM value) normally contained in the Si substrate in a region on the surface side of the Si substrate, which extends up to a depth of the order of a few $\mu$m.

In the wafer treating process 200, the ion implanting step 220 and the annealing step 230 are successively executed after the annealing step 210 described above. The ion implanting step 220 is substantially identical to the ion implanting step 110 shown in FIG. 1, whereas the annealing step 230 is substantially identical to the annealing step 130 shown in FIG. 1. Accordingly, the detailed description of the ion implanting step 220 and annealing step 230 will be omitted in the present embodiment.

Incidentally, the annealing step 210 may include, for example, laser anneal, electron beam anneal, infrared anneal or electric furnace anneal or the like.

In the present embodiment described above, the annealing is done in advance before the implantation of the impurity ion so as to lower the concentration of oxygen in the vicinity of the surface of the Si substrate. Thus, the oxygen can be inhibited from being bonded to each vacancy defect in the post-annealing step, and oxygen precipitated nuclei can be inhibited from occurring. Incidentally, the execution of the ion implanting step 120 employed in the first embodiment shown in FIG. 1 between the ion implanting step 220 and the annealing step 230 in the present embodiment allows a reduction in the amount of residual of the vacancy defects and makes it possible to implement further control on the occurrence of the oxygen precipitated nuclei.

(Third Embodiment)

Figure 3:
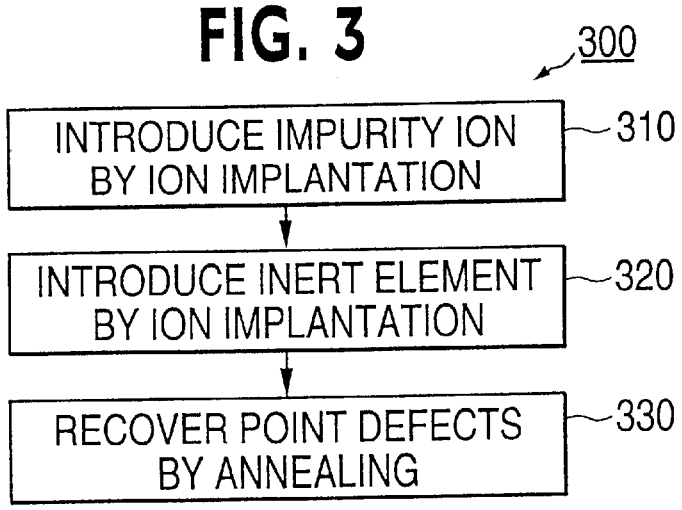
FIG. 3 is a flowchart for describing a further method of manufacturing a semiconductor device to which the present invention is applicable.

A third embodiment will next be described with reference to FIG. 3. FIG. 3 is a flowchart for describing a wafer treating process 300 of a method of manufacturing a semiconductor device, according to the present embodiment.

In the wafer treating process 300, an ion implanting step 310 corresponding to a first ion implanting step, an ion implanting step 320 corresponding to a third ion implanting step, and an annealing step corresponding to a post-annealing step are successively performed as shown in FIG. 3.

It is needless to say that the wafer treating process 300 may include, for example, a thin film forming step, an oxidizing step, a resist processing step, an exposing step, an etching step, a cleaning step or other steps such as another impurity introducing step, another annealing step, etc. It is further needless to say that the method of manufacturing the semiconductor device, according to the present embodiment may include other steps such as a mask manufacturing step, an assembling step or an inspecting step, etc. except for the wafer treating process 300.

In the wafer treating process 300, the ion implanting step 310 is substantially identical to the ion implanting step 110 shown in FIG. 1 and ion implantation is done at a projected range Rp1. Since the ion implanting step 110 shown in FIG. 1 is already described above, the detailed description of the ion implanting step 310 will be omitted in the present embodiment.

Ions of a predetermined element are introduced into an Si substrate subjected to the ion implanting step 310 to produce vacancy defects by ion implantation using a projected range Rp3 greater than the projected range Rp1. In such an ion implanting step 320, the ions of the predetermined element are introduced into the Si substrate with such accelerating energy that the peak of the projected range Rp3 falls within a range corresponding to, for example, 1.5 to 2 times the projected range Rp1.

In the ion implanting step 320, the dose of the predetermined element to be introduced is set to such an extent that it is possible to produce vacancy defects necessary to fill up excessive Si defects developed in the Si substrate in the ion implanting step 310. Such dose can be set from, for example, a process simulation, the past result of experiments, etc. In the ion implanting step 320, one obtained by ionizing an inert gas such as Ar(Argon) may preferably used as the predetermined element.

O-group elements (also called inert gases or noble gases) may also used instead of Ar. The O-group elements are hard to be bonded to the vacancy defects in the semiconductor layer and can be easily diffused outside the semiconductor layer by heat treatment or annealing. Thus, the ion implanting step 320 has a lower possibility of other crystal defects. As already known to date, the O-group elements include He (Helium), Ne (Neon), Ar(Argon), Kr (Krypton), Xe (Xenon) and Rn (Radon).

In the wafer treating process 300, the annealing step 330 is substantially identical to the annealing step 130 shown in FIG. 1. Since the annealing step 130 shown in FIG. 1 is already described above, the detailed description of the annealing step 330 will be omitted in the present embodiment.

In the present embodiment as has been described above, vacancy defects developed by ion implantation using an inert gas collect excessive Si defects produced at a depth corresponding to, for example, once to twice a projected range Rp1 upon implantation of an impurity ion in the case of post-annealing. It is thus possible to inhibit the occurrence of crystal defects developed in a relatively deep portion of an Si substrate, such as a dislocation loop produced by excessive Si, etc. As a result, crystal defects formed in a deep portion of an impurity diffused layer can be reduced and hence a diffused layer good in characteristic can be formed.

In the present embodiment, point defects occurs due to new excessive Si in a depth range corresponding to, for example, once to twice a projected range Rp2 of each inert gas ion. There is a possibility that such point defects will evolve into a dislocation loop. However, the dislocation loop can be controlled so as to occur at a position deeper than that of the impurity diffused layer owing to the suitable selection of accelerating energy and dose for ion implantation using the inert gas and the repetitive execution of the ion implantation.

In the present embodiment as well, the high concentration defects of the material element for the semiconductor layer can be forced into a sufficiently deep region in the semiconductor layer even if energy given by ion implantation per once of the ion implanting step 320 is relatively low. Thus, according to the present embodiment, crystal defects can be controlled while the amorphization of the semiconductor layer by ion implantation is being inhibited.

Namely, it is possible to avoid the influence exerted upon electric characteristics of the semiconductor device by the generated dislocation loop.

While the preferred embodiments according to the present invention have been described above, the present invention is not necessarily limited to the present construction. It can be contemplated by those skilled in the art that various modifications and changes of the illustrative embodiments can be made within the scope of the technical thought described in the appended claims. It will be understood that these modifications and changes are also included in the technical scope of the present invention.

While the method of manufacturing the semiconductor device to which the Si substrate is applied, has been illustrated as an example in the above-described embodiments, for example, the present invention is not necessarily limited to the present construction. The present invention can be applied even to a method of manufacturing a semiconductor device to which other various semiconductor layers, e.g., a semiconductor substrate, semiconductor element or chip, etc. composed of another material are applied.

While the aforementioned embodiments have illustrated examples of various values and have described the method of manufacturing the semiconductor device, according to the present invention by way of example, respectively, the present invention is not limited to the present construction. While the method of manufacturing the semiconductor device, which includes the formation of the impurity diffused layer, has been described by way of example in the above-described embodiments, the present invention is not necessarily limited to the present construction. The present invention can be applied even to, for example, a method of manufacturing a semiconductor device, including the formation of a PN junction by the introduction of an impurity.

In the present invention, vacancy defects and high concentration defects of a material element for a semiconductor layer can be canceled out each other within the semiconductor layer owing to the execution of another ion implantation other than the ion implantation using the impurity ion. In the present invention as well, the formation of oxygen precipitated nuclei is inhibited by reducing the concentration of interstitial oxygen in the neighborhood of the surface of the semiconductor layer. Thus, the rate of occurrence of precipitated nuclei of oxygen or an impurity metal and the rate of formation of a dislocation loop are reduced and hence crystal defects in the semiconductor layer due to the impurity ion implantation are hard to greatly occur.

What is claimed is:

1. A method of manufacturing a semiconductor device, comprising:

introducing an impurity ion into a first projected range of a semiconductor layer by ion implantation; and reducing residual vacancy defects in said semiconductor layer by introducing ions from an inert gas into a second projected range of said semiconductor layer in which the impurity ions are introduced by ion implantation, said second projected range being within a range of 1.5 to 2.0 times that of said first projected range, and wherein the ion implantation of said reducing residual vacancy defects is repeated twice or more, while said second projected range is extended sequentially.

2. The method according to claim 1, wherein the impurity ion is selected from a group including boron, phosphorus and arsenic.

3. The method according to claim 1, wherein said semiconductor layer comprises silicon, and the ion implantation of said reducing residual vacancy defects produces vacancies to fill up excessive silicon defects created during said introducing an impurity ion.

* * * * *